United States Patent [19]

Herrmann

[11] Patent Number: 4,906,551
[45] Date of Patent: Mar. 6, 1990

[54] PROCESS FOR THE POST-TREATMENT OF DEVELOPED RELIEF PRINTING FORMS FOR USE IN FLEXOGRAPHIC PRINTING

[75] Inventor: Heinz Herrmann, Wiesbaden, Fed. Rep. of Germany

[73] Assignee: Hoechst Aktiengesellschaft, Frankfurt am Main, Fed. Rep. of Germany

[21] Appl. No.: 280,426

[22] Filed: Dec. 6, 1988

[30] Foreign Application Priority Data

Dec. 12, 1987 [DE] Fed. Rep. of Germany ....... 3742275

[51] Int. Cl.$^4$ ................................................ G03F 7/02
[52] U.S. Cl. ..................................... 430/309; 430/300; 430/302; 430/306; 430/281
[58] Field of Search ............... 430/309, 306, 281, 302, 430/311

[56] References Cited

U.S. PATENT DOCUMENTS

| | | | |
|---|---|---|---|
| 3,036,913 | 5/1962 | Burg | 96/67 |
| 3,990,897 | 11/1976 | Zuerger et al. | 96/67 |
| 4,189,323 | 2/1980 | Buhr | 430/281 |
| 4,202,696 | 5/1980 | Takahashi et al. | 430/306 |
| 4,292,150 | 9/1981 | Farber et al. | 204/159 |
| 4,400,460 | 8/1983 | Fickes et al. | 430/306 |
| 4,401,740 | 8/1983 | Hoffmann et al. | 430/271 |
| 4,430,417 | 2/1984 | Heinz et al. | 430/286 |
| 4,451,553 | 5/1984 | Fickes et al. | 430/306 |
| 4,452,879 | 6/1984 | Fickes et al. | 430/306 |
| 4,459,348 | 7/1984 | Jun et al. | 430/271 |
| 4,603,058 | 7/1986 | Adams | 427/54.1 |
| 4,619,998 | 10/1986 | Buhr | 544/193.1 |
| 4,640,877 | 2/1987 | Schroder | 430/14 |
| 4,680,251 | 7/1987 | Schober | 430/306 |
| 4,725,528 | 2/1988 | Koch et al. | 430/309 |
| 4,845,013 | 7/1989 | Bach | 430/309 |

FOREIGN PATENT DOCUMENTS

| | | |
|---|---|---|
| 2823300 | 12/1979 | Fed. Rep. of Germany. |
| 3319676 | 12/1983 | Fed. Rep. of Germany. |
| 3704067 | 8/1987 | Fed. Rep. of Germany. |
| 62175735 | 4/1986 | Japan. |

OTHER PUBLICATIONS

"Bis-", Hawleys Condensed Chemical Dictionary, 11th edition, Van Nostrand Reinhold Co., NY., N.Y., p. 143.

*Primary Examiner*—Paul R. Michl
*Assistant Examiner*—Christopher D. RoDee
*Attorney, Agent, or Firm*—Foley & Lardner, Schwartz, Jeffery, Schwaab, Mack, Blumenthal & Evans

[57] ABSTRACT

The invention describes a process for the post-treatment of developed relief printing forms for use in flexographic printing. The relief printing forms are reexposed in a customary manner and thereafter treated according to the invention, using a solution which comprises an organic solvent and, dissolved therein, an aryl- or hetaryl-bis(trihalogenomethyl)-s-triazine; they are then dried and briefly reexposed to UV light. The process of the invention eliminates the tackiness of the surfaces of light-hardened flexographic printing forms comprising a photopolymer and it also considerably enhances the resistance of these printing forms to air containing ozone.

22 Claims, No Drawings

PROCESS FOR THE POST-TREATMENT OF DEVELOPED RELIEF PRINTING FORMS FOR USE IN FLEXOGRAPHIC PRINTING

BACKGROUND OF THE INVENTION

The present invention relates to a process for the post-treatment of developed relief printing forms for use in flexographic printing, which have been reexposed in a customary manner.

Photosensitive flexographic printing plates, in general, comprise a multilayer material. In most cases, they are formed of a dimensionally stable support; an adhesive layer; a photopolymerizable or photo-crosslinkable elastomeric layer, usually 0.5 to 7 mm thick, containing an elastomeric binder, polymerizable monomers, a photoinitiator and, optionally, additive substances; a non-tacky covering layer (polymer overcoat); and a detachable protective film.

The support may be made of a metal or, preferably, of a dimensionally stable, transparent plastic film. It serves to reinforce and maintain the dimensional stability of the elastomeric layer, which is optionally up to several millimeters thick, in the printing process. To obtain firm anchoring of the light-hardenable layer to the support an adhesive layer is required, which comprises, for example, a polyurethane or polychloroprene-based one-component or two-component adhesive, as described in DE-A No. 31 00 175, DE-A No. 31 07 741, DE-A No. 24 44 118 and DE-A No. 31 37 416, a polymerizable layer (U.S. Pat. No. 3,036,913) or a mixture of polyvinyl chloride and polyvinyl acetate (DE-A No. 33 19 676). EP-A No. 64 564 discloses mixtures of specific polyesters and polyamides, polyurethanes or polyolefins, which are used for the same purpose. Adhesive layers comprising a chlorosulfonated polyethylene are disclosed in German Patent Application, file No. P 37 40 432.6.

Upon imagewise exposure of photosensitive flexographic printing plates of this type, the image areas of the photopolymer layer are photopolymerized or photocrosslinked. After washing out the non-hardened layer areas by means of a suitable solvent a rubber-elastic relief printing form is obtained, which, as a rule, can be further hardened by reexposure to actinic light.

At the layer surface of the photopolymer layer photopolymerization proceeds incompletely, which is presumably caused by the increased concentration of oxygen present in this area. Incomplete polymerization is discernible by a tacky plate surface.

A tacky surface is inconvenient when the plates are used as printing plates. In the printing process, for example, the fluff of paper adheres to the tacky plates and, as a result, the printing quality is reduced. On the other hand, tacky plates arranged in a stack can be separated from one another only with difficulty.

Various methods can be employed to eliminate inconvenient surface tackiness.

Post-treatment with an aqueous solution containing free halogen for substances that release halogen is customary in practice. The plate can, for example, be immersed into an aqueous solution of NaOCl and HCl or treated with a bromine solution (DE-C No. 28 23 300), with a bromine solution containing a wetting agent (DE-A No. 35 21 955) or with an iodine solution (DE-A No. 30 71 141). A double treatment, i.e. first in a bromine or iodine bath and then in a NaOCl/HCl bath has also been recommended (EP-A No. 0 096 835=U.S. Pat. No. 4,451,553).

The solutions used in these processes are, however, aggressive and have a corrosive effect.

Apart from this, the printing form can also be treated with a solution of carbonyl compounds forming free radicals under the action of UV light, followed by irradiation with short-wave UV light (U.S. Pat. No. 4,202,696). This process, however, has the disadvantage that it uses UV light (200–300 nm) which is injurious to health and which requires special lamps for generation. In addition, the exposure times are relatively long (up to 15 minutes).

According to another method the tacky printing form is exposed to UV light, while being immersed in an aqueous bath containing photopolymerizable monomers and photoinitiators (WO 86/02177).

It is a disadvantage of this method that an expensive special apparatus is necessary and that the solutions or dispersions used are not stable.

Moreover, the printing form can be coated with a solution containing non-tacky binders, photopolymerizable monomers and photoinitiators and subsequently exposed to UV light (DE-A No. 37 04 067). These coatings are, however, relatively hard and reduce the flexibility of the printing form.

The most widely used post-treatment in a bromine-containing bath not only has the above-described disadvantages but also intensifies the printing form's tendency to develop cracks when in contact with ozone-containing air. Crack formation can render the printing form useless. The number and severity of the cracks are dependent on the composition of the elastomeric photopolymer layer. By using antiozonants, plasticizers and elastomers that do not contain olefinic double bonds the tendency to crack formation can be reduced. It is, however, difficult to find suitable compatible and non-toxic compositions that, upon photopolymerization, yield relief printing forms having good mechanical properties and, at the same time, a low sensitivity to ozone.

In nearly all commercial flexographic printing plates comprising photopolymers resistance to ozone needs improving, even in those cases in which the photopolymer layer contains a high proportion of antiozonants. Various post-treating methods have therefore been proposed, which are intended to prevent crack formation during storage of printing forms that have already been rendered non-tacky.

A process of this kind concerns the treatment of printing forms with solutions of nickel or zinc dialkyldithiocarbamates in an organic solvent (EP-A No. 0 137 331). The solutions used have, however, the disadvantage of being physiologically unsafe.

According to other methods the relief printing form is coated with an alcoholic polyamide solution (DE-A No. 34 15 044) or treated with liquid polyglycol ethers (DE-A No. 35 12 632). These methods may effect protection of the printing form before or even after the printing operation, but during the printing operation the substances protecting the printing form from ozone are washed out by the solvents of the printing inks.

SUMMARY OF THE INVENTION

Accordingly, it is an object of the present invention to provide a process for the post-treatment of developed relief printing forms which eliminates surface tackiness.

Another object of the present invention is to provide a post-treatment process which permanently increases the resistance of the printing form to ozone-containing air.

A further object of the present invention is to provide a post-treatment process which does not employ aggressive solutions, and which is speedily and easily performed.

In accomplishing the foregoing objectives, there has been provided, in accordance with one aspect of the present invention, a process for the post-treatment of developed relief printing forms, which have been reexposed in a customary manner, for use in flexographic printing, comprising the steps of: treating the relief printing forms with a solution comprising (a) an organic solvent and (b) at least one aryl- or hetaryl-bis(-trihalogenomethyl)-s-triazine compound of the general formula I

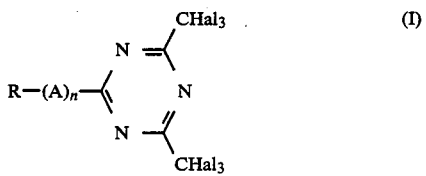

in which
A denotes a conjugated alkylene chain,
R denotes a substituted or unsubstituted aromatic or heterocyclic aromatic radical, or an optionally partially hydrogenated radical which is linked by an unsaturated carbon atom of a ring system and is also optionally substituted, in particular by aryl or Ar(-$C_2$-$C_6$)-alkylene,
Hal denotes a chlorine, bromine or iodine atom, and
n is 0 or 1;
drying the relief printing forms; and briefly reexposing the relief printing forms to UV light. In one preferred embodiment, Y is a naphthyl radical of the general formula II:

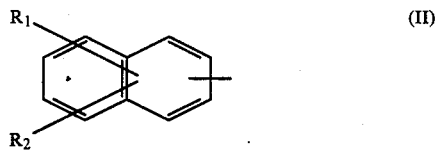

in which
$R_1$ denotes H or —$OY_3$
$Y_2$ denotes H, Cl, Br, a lower alkyl or alkenyl, aryl, or a substituted or unsubstituted ($C_1$-$C_4$) alkoxy radical, and
$Y_3$ denotes a substituted or unsubstituted ($C_1$-$C_8$) alkyl or alkoxyalkyl, cycloalkyl, alkenyl or aryl radical.

In another preferred embodiment, R is a naphthyl, radical of general formula II, in which $R_1$ and $R_2$ together denote an alkylene radical, which is preferably linked to the naphthalene ring to form a 5- or 6-membered ring.

In a further preferred embodiment, R is a 4-styrylphenyl radical.

In accordance with another aspect of the present invention, there has been provided an ozone-resistant relief printing form, having a non-tacky surface, produced by the recited process.

Other objects, features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF THE PREFERRED EMBODIMENTS

The process of the present invention can successfully be employed for any light-hardenable flexographic printing forms comprising photopolymers and having a tacky surface. Moreover, it can also be used for other, non-elastomeric tacky printing forms comprising photopolymers. In general, the process is suitable for reducing the tackiness of any solid polymer layers.

The suitable aryl- or hetaryl-bis(trihalogenomethyl)-s-triazine may be substituted in the aryl or hetaryl ring by the following substituents:

Halogen, in particular, chlorine and bromine, lower, optionally substituted alkyl radicals which preferably have from 1 to 3 carbon atoms, optionally substituted aryl radicals, nitro, sulfonyl, alkylmercapto, phenylmercapto, acyl, aryloxy, hydroxy and, preferably, alkoxy radicals, particularly preferably ($C_1$-$C_8$)alkoxy radicals which, in turn, may be substituted by halogen, phenyl or phenoxy and in which some methylene groups may be replaced by O- or S-bridges, and also phenoxy, cycloalkoxy and alkenyloxy radicals.

Aromatic radicals which can be used comprise phenyl and binuclear or polynuclear aromatic radicals; heterocyclic aromatic compounds are, however, also included.

Examples of suitable aromatic radicals comprise: naphthalene, anthracene, phenanthrene, quinoline, isoquinoline, benzofuran, benzopyran, dibenzofuran, benzothiophene, dibenzothiophene, acenaphthene, benzoxazole, fluorene, tetrahydrophenanthrene and dihydrophenalene.

If R denotes an aryl (n=0) or R and A together denote an aralkenyl radical (n=1), this radical is preferably substituted by halogen, in particular, chlorine, alkoxy, in particular, ($C_1$-$C_6$)alkoxy, alkyl, in particular, ($C_1$-$C_4$)alkyl, allyloxy, hydroxy, or amino which can also be substituted by alkyl.

If aryl denotes phenyl, the latter is preferably substituted in positions 2 and/or 4, but also in positions 3 and/or 4, provided that the substituent is alkoxy.

The substituents mentioned are also applicable in the case of R and A together denoting an aralkenylene radical (n=1), containing ($C_2$-$C_6$)alkylene, in particular, ($C_2$-$C_4$)alkenylene. Particularly preferred are styryl and phenylbutadienyl compounds.

The aromatic radicals linked to the triazine ring by an alkenyl group particularly preferably include:
Styryl-, 4-methylstyryl-, 4-chlorostyryl-, 2-hydroxystyryl-, 4-methoxystyryl-, 4-tert-butoxystyryl-, 4-amyloxystyryl-, 4-allyloxystyryl-, 3-methoxy-4-hydroxy-styryl-, 2,4-dimethoxystyryl-, 3,4-dimethoxystyryl-, 4-dimethylaminostyryl-, phenylbutadienyl-, 4-dimethylminophenyl-butadienyl-, and 3-(N-ethylbenzoxazolyl-2-idene)-propen-1-yl-.

If R denotes an aryl radical that is not linked by an alkenyl group to the triazine ring, this aryl radical preferably comprises phenyl or naphthyl or one of the above-mentioned binuclear or polynuclear, also heterocyclic compounds. These may have the above-indicated general substituents or may be substituted by aryl or Ar($C_2$–$C_6$)alkenyl. Substitution by Ar($C_2$–$C_6$)alkenyl is preferred, if the aromatic radical carrying this substituent comprises phenyl. An Ar($C_2$)alkenyl radical is particularly preferred and this substituent is preferably in the 4-position. In this case, the aryl used is, in particular, phenyl.

The following are examples of R denoting an optionally substituted phenyl:

Phenyl-, 4-chlorophenyl-, 4-methoxyphenyl-, 2,4-dichlorophenyl-, 4-phenylphenyl-.

Examples of Y denoting phenyl substituted by Ar(-$C_2$–$C_6$)alkenyl are listed below:

4-Styrylphenyl-, 4-p-methoxystyryl-phenyl-, 4-p-methylstyryl-phenyl-, 4-p-chlorostyryl-phenyl-, 4-o-chlorostyryl-phenyl-, 4-m-chlorostyryl-phenyl-, 4-p-bromostyryl-phenyl-, 4-m,p-dimethoxystyryl-phenyl-, 4-p-ethoxystyryl-phenyl-, 4-m,m,p-trimethoxystyryl-phenyl-, 4-p-hexylstyryl-phenyl-, 3-chloro-4-styrylphenyl-, 3-chloro-4-m-chlorostyryl-phenyl-, 3-chloro-4-p-methylstyryl-phenyl-, and 2-styryl-phenyl-.

If R is a naphthyl radical the latter corresponds to the general formula II

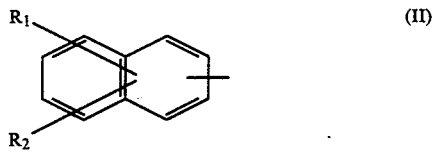

wherein
$Y_1$ denotes hydrogen or —$OY_3$, preferably —$OR_3$,
$R_2$ denotes H, Cl, Br, a lower alkyl, alkenyl, aryl or an optionally substituted ($C_1$–$C_4$)alkoxy radical, particularly preferably hydrogen, a ($C_1$–$C_3$)alkyl or ($C_1$–$C_3$)alkoxy radical, and
$Y_3$ denotes a ($C_1$–$C_8$)alkyl radical, which may be substituted by halogen, preferably chlorine or bromine, aryl or aryloxy radicals and in which some methylene groups may be replaced by O- or S-bridges, a cycloalkyl, alkenyl or aryl radical, in particular, a ($C_1$–$C_4$)alkyl or alkoxyalkyl radical, or $R_1$ and $R_2$ together denote an alkylene radical, which is preferably linked to the naphthalene ring to form a 5- or 6-membered ring.

Preference is also given to compounds, in which the s-triazinyl radical and an alkoxy radical are in the 1,4 or 2,6-positions of the naphthalene ring.

Since the number of carbon atoms contained in the alkoxy groups has only an insignificant influence on the photochemical activity of the initiators, the limitation to eight carbon atoms in —$OR_3$ does not represent a strict limit, but can optionally be surpassed, for example, by nonyloxy, dodecyloxy or octadecyloxy radicals.

In detail, R can comprise the following naphthyl radicals:

Naphth-1-yl-, naphth-2-yl-, 2-methoxynaphth-1-yl-, 4-methoxynaphth-1-yl-, 5-methoxynaphth-1-yl-, 4-ethoxynaphth-1-yl-, 4-butoxynaphth-1-yl-, 1-methoxynaphth-2-yl-, 3-methoxynaphth-2-yl-, 6-methoxynaphth-2yl-, 6-ethoxynaphth-2-yl-, 4,5-dimethoxynaphth-1-yl-, 4,7-dimethoxynaphth-1-yl-, 4-(2-methoxyethyl)-naphth-1-yl-, 4-(2-ethoxyethyl)-naphth-1-yl-, 4-(2-butoxyethyl)-naphth-1-yl-, 5-methyl-6-methoxynaphth-2-yl-, and 4-(2-ethoxy)-ethoxynaphth-1-yl-.

Particularly preferred compounds also include those, in which $R_1$ and $R_2$ together form an alkylene radical that is preferably linked to the naphthalene ring to form a 5- or 6-membered ring. In this connection, acenaphth-5-yl may be mentioned in particular.

Other preferred polynuclear radicals represented by R include:

4-Methoxy-anthrac-1-yl-, phenanthr-9-yl-, benzopyran-3-yl, quinol-3-yl- and dibenzothien-3-yl-.

The compounds corresponding to the general formula I are known per se and are described, for example, in U.S. Pat. No. 3,779,778 (=DE-A No. 23 06 248), U.S. Pat. No. 3,954,475 (=DE-A No. 22 43 621) and U.S. Pat. No. 4,239,850 and also in DE-A No. 27 18 259, DE-A No. 29 34 758 and DE-A No. 33 37 024.

It is preferred to employ aryl- or hetaryl-bis-trihalogenomethyl-s-triazines having an absorption peak in the range from 300 to 500 nm.

In the process of the present invention, mixtures of several, in particular of two or three, aryl- or hetaryl-bis(trihalogenomethyl)-s-triazine can also be used.

Solvents that can be employed for the above-described triazine derivatives comprise almost any organic solvents, for example, aliphatic and aromatic hydrocarbons, halohydrocarbons, ethers, esters, ketones, alcohols, dimethylformamide, etc. It is also possible to use mixtures of at least two solvents. Preference is given to solvents that have a good dissolving power, are readily volatile and physiologically safe such as, for example, toluene, tetrahydrofuran, ethyl acetate, methyl ethyl ketone, etc.

The concentration of the triazine derivatives in the solvents used can vary within wide limits and may range from 0.1% by weight up to the saturation value. It is particulary preferred to use solutions having concentrations from 2 to 15% by weight, in particular, from 2 to 7% by weight.

The treating solutions employed according to the present invention can additionally contain minor amounts of soluble binders and also soluble dyes. Suitable binders comprise non-tacky polymers, for example, vinylidene chloride copolymers, cyclized rubbers, polycarbonates, polyacrylates, polystyrenes, polyamides, etc.

It is possible to use 0.01 to 1 part, preferably 0.05 to 0.5 part, of binder for one part of aryl- or hetaryl-bis(-trihalogenomethyl)-s-triazines. A relatively high binder content produces non-tacky coatings on the printing forms, which can easily be removed by means of solvents.

By the addition of binders the concentration of aryl or hetaryl-bis(trihalogenomethyl)-s-triazine can be reduced, since the polymers used themselves help to eliminate tackiness. In general, up to 50% of the triazine derivative can be replaced by binders, without thereby jeopardizing the advantageous characteristics of the process according to the present invention. What is more, replacing part of the triazine derivatives by binders has the advantageous effect of reducing the cost of the treating solution.

The light-hardenable compound contained in the light-hardenable layer may comprise a polymer which, upon exposure, is crosslinked to an insoluble state, either by itself or by a photosensitive crosslinking agent. The light-hardenable layer preferably comprises a photopolymerizable layer which, in addition to the elastomeric binder, contains an ethylenically unsaturated compound which can be polymerized by free radicals and a photoinitiator forming free radicals upon exposure. Compositions of this kind are known and are described, for example, in the above-indicated publications.

Elastomers which can be used comprise any types of natural or synthetic rubbers. Preference is given to block copolymers of vinyl compounds, e.g. styrene, and dienes, such as butadiene or isoprene.

Acrylic or methacrylic acid esters of polyhydric alcohols, for example hexanediol-1,6-diacrylate and hexanediol-1,6-dimethacrylate, are usually employed as polymerizable, ethylenically unsaturated monomers. However, the layer may also contain other esters of acrylic and methacrylic acid with monohydric or polyhydric alcohols. In addition, it is also possible to use other unsaturated monomers, for example, vinyl esters of aliphatic monocarboxylic acids or maleic acid ester and fumaric acid ester, etc.

For one part of the elastomeric binder 0.05 to 0.3 part of an ethylenically unsaturated monomer is used.

A great number of substances can be employed as photoinitiators in the composition. Examples are those which are derived from the parent substance of benzophenones, benzoins, benzils, benzilmonoketals, of fluorenone, thioxanthone, of polynuclear quinones, acridines and quinoxalines; and also trichloromethyl-s-triazines, carbonylmethylene heterocycles containing trihalogenomethyl groups, according to DE-A No. 33 33 450 or acylphosphine oxide compounds, as described, for example, in DE-A No. 31 33 419.

In general, the initiators are employed in an amount of 0.01 to 10, preferably 0.05 to 5, percent by weight, based on the non-volatile constituents of the layer.

Moreover, the photopolymerizable layer can contain additive substances which improve the storability, the copying behavior and other properties. Customary additive substances include, for example, inhibitors to prevent thermal polymerization, dyes, antioxidants, antiozonants, plasticizers and fillers.

The photopolymerizable layer can be uniform or comprise several superimposed layers having different compositions. It is, for example, possible to use two-layer photopolymerizable layers, in which, after polymerization, the layer which is remote from the support shows a greater hardness than the layer facing the support. The entire photopolymerizable layer has, in general, a thickness of 0.05 to 7 mm, preferably 0.2 to 5 mm.

As is known in the art, the photopolymerizable layer may be covered by a thin, non-tacky polymer layer which is soluble in the developer, for example, a layer comprising soluble polyamides, and a thicker, peelable protective film. The polymer layer usually has a thickness of 1 to 20 µm and the protective film is about 50 to 200 µm thick.

Preferred dimensionally stable support films for the photopolymer layer comprise 50 to 300 µm thick transparent plastic films, for example, of polyesters, polycarbonates, polyimides and the like. Polyethylene terephthalate films are particularly preferred. If it is intended to arrange the support between a photopolymer layer and a rubber-elastic base sheet, the support may also have a lower thickness, for example, down to 10 µm. The surface of the polyethylene terephthalate film is, in general, coated with an adhesive layer or a layer comprising an adhesion promoting substance.

The rubber-elastic, 0.5 to 7 mm thick photopolymerizable layer can be prepared in a known manner, by evaporating a solution of the layer components, by molding a homogeneous kneading mass between parallel plates, or by extruding through a flat sheet die followed by calendering of the web. In the preparation of the photopolymerizable layer according to the last-mentioned method, it is advantageous to join the layer in the hot state, while it is still in the calender, to the support film carrying the adhesive layer and to the protective film.

If it is intended to apply a non-photosensitive soft rubber sheet or elastic foam sheet to the back of the support film, both surfaces of the support film must be provided with an adhesive layer. The adhesive layer on the back of the support film can be applied prior to, during, or after joining the support film to the photopolmerizable layer. If the laminate is not prepared in one operation, the unprotected adhesive layer must be covered by a readily peelable film during the laminating process, in order to prevent soiling of the laminator rolls.

The multilayer flexographic printing plate material is processed in a conventional manner to give ready-for use printing forms. First, a printing plate base is prepared by uniformly exposing the element through the support film. After peeling off the protective film, the opposite surface is exposed through a negative film original. Thereafter, the unexposed, non-hardened areas are washed out with a suitable developer, for example, a mixture of perchloroethylene and n-butanol.

The tacky, elastomeric printing forms thus prepared are first reexposed in a known manner—for example, for 10 minutes using an exposure unit equipped with a 320 watt fluorescent tube (320 watt UV lamp), as is customarily employed for the production of the printing forms—to complete the crosslinking reaction and are then subjected to the treatment of the present invention to eliminate tackiness. Reexposure must be carried out prior to post-treating, because the aryl or hetaryl-bis(trihalogenomethyl)-s-triazine which is present on the printing form during the post-treatment according to the invention would absorb too much of the actinic light required for the further crosslinking.

Different methods can be employed when subjecting the reexposed, still tacky printing form to the treatment according to the present invention. The solutions of aryl- or hetaryl-bis(trihalogenomethyl)-s-triazine can be applied to the printing form by spraying, brushing or rolling on with appropriate soft, absorbent rolls. It is, however, also possible to immerse the printing forms into the solutions. The treatment time can vary between 1 second and several minutes. The higher the concentrations of the solutions used, the shorter the treatment time. In the case of using solutions having a concentration of about 5% by weight, immersion for about 10 seconds is, as a rule, sufficient.

After treatment with these solutions, the printing forms are dried. If readily volatile solvents are used the printing forms can be dried by allowing them to lie in the air for a short period. It is, however, also possible to dry the printing forms by exposing them to warm air or placing them into a heating cabinet. In that case it must be ensured that the decomposition temperatures of the aryl-bis-trihalogenomethyl-s-triazine are not reached. Temperatures below 120° C. are preferred.

Even after evaporation of the solvent, the printing forms treated with an aryl- or hetaryl-bis(- trihalogenomethyl)-s-triazine solution are often still noticeably tacky. They are only rendered entirely non-tacky when they are briefly reexposed to longwave UV light. Any light sources emitting light of this type can be used for this purpose. Fluorescent tubes, mercury vapor lamps and metal halide lamps are, for example, mentioned in this connection.

The quantity of light required for the reexposure of the treated printing forms is only about 10% of the quantity of light necessary for the production of a relief pattern. A light energy of 350 to 500 mJ/cm$^2$ is sufficient to detackify the surfaces. The necessary exposure times with the conventionally used light sources (1 to 5 mW/cm$^2$) amount to about 2 to 5 minutes.

The mechanism of the reaction leading to an elimination of tackiness has not yet been clarified. In the treatment, the surface of the printing form is permanently modified. Subsequent wiping with solvents does not bring back the tacky condition.

The examples below describe preferred embodiments of the invention. Unless otherwise indicated, all percentages and quantitative proportions given are to be understood as denoting weight units. Parts by weight (pbw) and parts by volume (pbv) are related as the g is related to the cm$^3$.

EXAMPLES 1 TO 5

Five different commercial flexographic printing plates were exposed imagewise as indicated in the specification and the unexposed, non-hardened areas were then washed away using, in each case, an appropriate commercial developer. The printing forms were thereafter reexposed for 10 minutes by means of a 320 watt UV lamp. The still tacky printing forms were subsequently treated according to the method of the present invention with a 6% by weight solution of 2-stilbenyl-4,6-bis(trichloromethyl)-s-triazine in toluene, for 10 seconds, i.e., they were immersed into the solution, briefly dried and then again reexposed, but now for 2 minutes, using the above-described UV lamp.

The plates did not show any tackiness of the surfaces. In addition, they had a relatively high resistance to ozone. To test the resistance to ozone, the printing plates were placed in a box and exposed, at room temperature, to air having an ozone content of 0.4 ppm.

The test results are compiled in the Table below.

COMPARATIVE EXAMPLES C$_1$ TO C$_5$

The commercial flexographic printing plates used in Examples 1 to 5 were exposed and developed as described above. The printing forms obtained were subsequently immersed for 5 minutes into an 0.4% by weight aqueous bromine solution, in a known manner, rinsed with water for 10 minutes and finally reexposed for 10 minutes, using a 320 watt UV lamp.

These plates also did not show any tackiness of the surfaces, but when treating them with ozone-containing air, as described in Examples 1 to 5, they showed a substantially lower resistance to ozone than the plates produced according to the present invention.

The test results are compiled in the Table below.

TABLE

| Flexographic Printing Plate | Comparative Example | Treatment with Bromine Solution | Example | Treatment 2-stilbenyl-4,6-bis trichloromethyl-s-triazine solution |
|---|---|---|---|---|
| ® Cyrel HLS | C$_1$ | 2 min | 1 | 4 h |
| ® Cyrel HOS | C$_2$ | 10 min | 2 | 10 h |
| ® Cyrel PQS | C$_3$ | 0.5 min | 3 | 0.5 h |
| ® Nyloflex FA | C$_4$ | 2 min | 4 | 5 h |
| ® Flexlight KOR | C$_5$ | 1 min | 5 | 3 h |

The times given in this table indicate the periods, after which first cracks appeared on the plates treated with ozone-containing air.

EXAMPLE 6

The commercial flexographic printing plate ®Cyrel HLS (DuPont) was processed into a flexographic printing form as described in Examples 1 to 5. The reexposure time was 10 minutes. The printing form was then treated for 20 seconds with a solution of 4% by weight of 2-stilbenyl-4,6-bis(trichloromethyl)-s-triazine and 1% by weight of cyclized rubber in toluene. After 2 minutes reexposure to the light of a 120 watt UV lamp, a non-tacky printing form resulted, which had an excellent resistance to ozone-containing air.

EXAMPLES 7 TO 9

Three commercial flexographic printing plates, type ®Cyrel HLS, were exposed, developed and reexposed as described in Examples 1 to 5. One plate each was then treated for 15 seconds with one of the following aryl-bis(trichloromethyl)-s-triazines, in each case in the form of a 5% by weight solution in toluene.

| Example | aryl-bis(trichloromethyl)-s-triazine |
|---|---|
| 7 | 2-stilbenyl-4,6-bis(trichloromethyl)-s-triazine |
| 8 | 2-(4-ethoxy)naphth-1-yl-4,6-bis(trichloromethyl)-s-triazine |
| 9 | acenanaphth-5-yl-4,6-bis(trichloromethyl)-s-triazine |

The printing forms were dried and reexposed for 3 minutes, using a 120 watt UV lamp.

The printing form obtained in each case was non-tacky and resistant to ozone-containing air. Mixtures of these triazine derivatives also yielded good results. The mixing ratio can be varied within wide limits, depending on the requirements of the particular commercial flexographic printing plate used.

EXAMPLES 10 TO 12

Commercial flexographic printing plates, type ®Cyrel HLS, were exposed, developed and reexposed as described in Examples 1 to 5. The printing forms were then treated with a 6% by weight solution of 2-stilbenyl-4,6-bis(trichloromethyl)-s-triazine in toluene.

Depending on the exposure unit used in each case, the following exposure times and light energies, resp., were necessary to produce printing forms that were non-tacky and had an excellent resistance to ozone-containing air.

| Example | Exposure Unit | Exposure Time | Energy |
|---|---|---|---|
| 10 | 120 watt fluorescent tube (4.0 mW/cm$^2$) | 2 minutes | 480 mJ/cm$^2$ |
| 11 | 5 kW metal halide lamp arranged at a distance | 3 minutes | 430 mJ/cm$^2$ |

-continued

| Example | Exposure Unit | Exposure Time | Energy |
|---|---|---|---|
| | of 140 cm (2.4 mW/cm²) | | |
| 12 | 125 watt mercury vapor lamp arranged at a distance of 35 cm (1.2 mW/cm²) | 5 minutes | 360 mJ/cm² |

What is claimed is:

1. A process for the post-treatment of developed relief printing forms, which have been reexposed in a customary manner, for use in flexographic printing, comprising the steps of:

treating the relief printing forms with a solution comprising:

(a) an organic solvent and (b) at least one aryl- or hetaryl-bis(trihalogenomethyl)-s-triazine compound of the general formula I

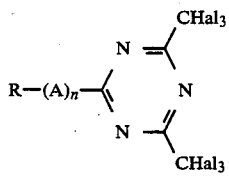

in which

A denotes a conjugated alkylene chain,

R denotes a substituted or unsubstituted aromatic or heterocyclic aromatic radical, Hal denotes a chlorine, bromine or iodine atom, and n is 0 or 1;

wherein the concentration of said aryl- or hetaryl-bis(trihalogenomethyl)-s-triazine in said solution is between 0.1% by weight and the saturation value of said compound in said solvent;

drying the relief printing forms; and briefly reexposing the relief printing forms to UV light.

2. A process as claimed in claim 1, wherein n=0 and R is a substituted or unsubstituted phenyl radical.

3. A process as claimed in claim 2, wherein said substitutent comprises an aryl or aralkenyl group.

4. A process as claimed in claim 3, wherein said aralkenyl group is a Ar(C₂-C₆) alkenyl group.

5. A process as claimed in claim 2, wherein R is a 4-styrylphenyl group.

6. A process as claimed in claim 1, wherein n=0 and R is a naphthyl radical of the general formula II:

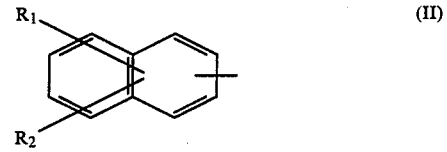

in which $R_1$ denotes H or —$OR_3$, $R_2$ denotes H, Cl, Br, a lower alkyl or alkenyl, aryl, or a substituted or unsubstituted ($C_1$–$C_4$) alkoxy radical, and $R_3$ denotes a substituted or unsubstituted ($C_1$–$C_8$) alkyl or alkoxyalkyl, cycloalkyl, alkenyl or aryl radical.

7. A process as claimed in claim 6, wherein R is a 4-ethoxynaphth-1-yl radical.

8. A process as claimed in claim 6, wherein R is a naphthyl radical of general formula II, in which $R_1$ and $R_2$ together denote an alkylene radical.

9. A process as claimed in claim 8, wherein said alkylene radical is linked to the naphthalene ring to form a 5- or 6-membered ring.

10. A process as claimed in claim 8, wherein R is a 2-acenaphth-5-yl radical.

11. A process as claimed in claim 1, wherein n=1 and A is a ($C_2$–$C_6$)alkenylene group.

12. A process as claimed in claim 1, wherein Hal is a chlorine atom.

13. A process as claimed in claim 1, wherein said concentration is between about 2% and about 15%.

14. A process as claimed in claim 1, wherein said solution comprises a plurality of different aryl- or hetaryl-bis(trihalogenomethyl)-s-triazine compounds.

15. A process as claimed in claim 1, wherein said aryl- or hetaryl-bis(trihalogenomethyl)-s-triazine compounds have absorption peaks in the range from about 300 to 500 nm.

16. A process as claimed in claim 1, wherein said solution additionally comprises a binder.

17. A process as claimed in claim 16, wherein said binder comprises a non-tacky polymer which is contained in the post-treating solution in a concentration of from about 0.01 to 1 part per part of said aryl- or hetaryl-bis(trihalogenomethyl)-s-triazine compound.

18. A process as claimed in claim 17, wherein the concentration of said binder is from about 0.05 to 0.5 part per part of said aryl- or hetaryl-bis(trihalogenomethyl)-s-triazine compound.

19. A process as claimed in claim 1, wherein said solvent comprises aliphatic hydrocarbons, aromatic hydrocarbons, halohydrocarbons, ethers, esters, ketones and alcohols.

20. A relief printing form having a non-tacky surface produced by the process of claim 1.

21. A process as claimed in claim 1, wherein said step of reexposing the relief printing forms is performed for a time sufficient to render the surfaces of said forms non-tacky.

22. A process as claimed in claim 1, wherein the solution consists essentially of the organic solvent and the aryl- or hetaryl-bis(trihalogenomethyl)-s-triazine.

* * * * *